United States Patent [19]

Yonehara

[11] Patent Number: 5,531,182

[45] Date of Patent: Jul. 2, 1996

[54] METHOD OF MAKING A SEMICONDUCTOR THIN-FILM

[75] Inventor: Takao Yonehara, Atsugi, Japan

[73] Assignee: Canon Kabushiki Kaisha, Tokyo, Japan

[21] Appl. No.: 241,678

[22] Filed: May 12, 1994

Related U.S. Application Data

[63] Continuation of Ser. No. 65,447, May 24, 1993, abandoned, which is a continuation of Ser. No. 819,641, Jan. 10, 1992, abandoned, which is a continuation of Ser. No. 501,667, Mar. 30, 1990, abandoned.

[30] Foreign Application Priority Data

| Mar. 31, 1989 | [JP] | Japan | 1-081101 |
| Mar. 31, 1989 | [JP] | Japan | 1-081697 |
| Jun. 26, 1989 | [JP] | Japan | 1-163429 |

[51] Int. Cl.$^6$ ................................................ H01L 21/20
[52] U.S. Cl. ...................... 117/7; 117/913; 437/109; 437/247; 437/967; 437/973; 148/DIG. 1; 148/DIG. 3
[58] Field of Search ................................... 437/173, 174, 437/103, 109, 21, 24, 973, 967; 148/DIG. 1, DIG. 3; 117/913, 7

[56] References Cited

U.S. PATENT DOCUMENTS

| 3,620,833 | 12/1966 | Gleim et al. | 437/62 |
| 4,379,020 | 4/1983 | Glaeser et al. | 148/DIG. 1 |
| 4,463,492 | 8/1984 | Maeguchi | 437/21 |
| 4,509,990 | 4/1985 | Vasudev | 437/912 |
| 4,585,493 | 4/1986 | Anthony | 148/171 |
| 4,592,799 | 6/1986 | Hayafuji | 437/173 |
| 4,904,611 | 2/1990 | Chiang et al. | 437/24 |

FOREIGN PATENT DOCUMENTS 169905  1/1984  Japan.

OTHER PUBLICATIONS

S. Wolf & R. N. Tauber *Silicon Processing for the VLSI Era vol. 1: Process Technology*; Lattice Press; Sunset Beach CA PP. 175–176 (1986).
M. K. Hatalis et al, "Solid Phase Epitaxy of LPCVD Amorpous Silicon Films," Journal of the Electrochemical Society, Oct. 1987, pp. 2536–2540.
C. V. Thompson et al., "Surface–Energy–Driven Secondary Grain Growth in Ultrathin (<100nm) Films of Silicon," Appl. Phys. Ltrs, Mar. 1984, pp. 603–605.
S. M. Sze, *Physics of Semiconductor Devices Second Edition*, John Wiley & Sons, New York, N.Y. (1981) p. 850.
T. B. Massalski, Editor et al., *Binary Alloy Phase Diagrams Volume 2*, American Society for Metals, Metals Park, OH (1986), p. 2050.
Nuclear Instruments and Methods of Physics Research, vol. B37/38, Feb. 1989, pp. 387–390.
Nuclear Instruments and Methods in Physics Research B19/20, 1987, pp. 363–368.
IBM Technical Disclosure Bulletin, vol. 24, No. 8, Jan. 1982, pp. 4272–4273.
Thin Films and Interfaces, Proceedings, 1984, Materials Research Society Symposia Proceedings, vol. 25, pp. 305, 310.
T. Noguchi et al., "Polysilicon Super Thin Film Transistor Technology", Mat. Res. Soc. Symp. Proc., vol. 106, 1988, pp. 293–304.
Y. Wada et al., "Grain Growth Mechanism of Heavily Phosphorus–Implanted Polycrystalline Silicon", J. Electrochem. Soc., vol. 125, No. 9, Sep. 1978, pp. 1499–1504.

*Primary Examiner*—R. Bruce Breneman
*Assistant Examiner*—Linda J. Fleck
*Attorney, Agent, or Firm*—Fitzpatrick Cella Harper & Scinto

[57] ABSTRACT

Polycrystalline silicon thin-films having a large grain size are formed by preparing a substrate of amorphous surface comprising first regions containing tin atoms at a higher content and second regions containing tin atoms at a lower content or not substantially containing them, and then heat-treating the substrate to grow crystal grains from crystal nuclei formed only in the first regions.

5 Claims, 7 Drawing Sheets

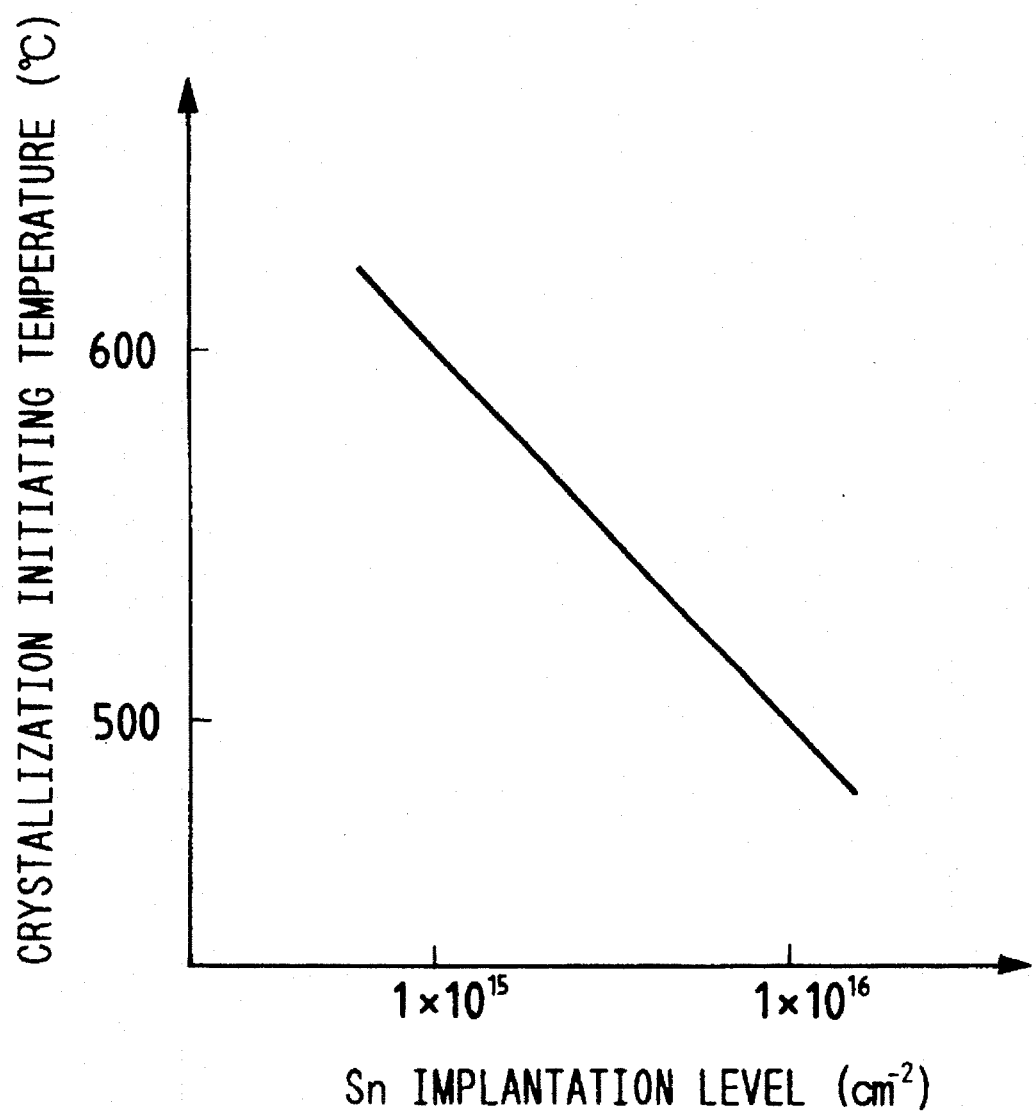

0: Sn NO ADDITION (Si$^+$ 70kV 5×10$^{15}$IONS/cm$^2$)
1: Sn 110kV 1×10$^{15}$IONS/cm$^2$ IMPLANTATION
2: Sn 110kV 1×10$^{16}$IONS/cm$^2$ IMPLANTATION

METHOD OF MAKING A SEMICONDUCTOR THIN-FILM

This application is a continuation of application Ser. No. 08/065,447 filed May 24, 1993, now abandoned, which is a continuation of application Ser. No. 07/819,641 filed Jan. 10, 1992, now abandoned, which is a continuation of application Ser. No. 07/501,667 filed Mar. 30, 1990, now abandoned.

BACKGROUND OF THE INVENTION

1. Field of the Invention

The present invention relates to a method for forming a semiconductor thin-film, and a resulting semiconductor thin-film formed thereby.

More particularly, the present invention relates to a method for forming a semiconductor thin-film of polycrystalline silicon of a large grain size which makes feasible the production of semiconductor devices such as a thin-film transistor (TFT) and the like having a high performance.

2. Related Background Art

Regarding the technique for forming a polycrystalline silicon semiconductor thin-film of a large grain size, a method was reported in which an amorphous silicon thin-film is allowed to grow in a solid phase to form a polycrystalline silicon thin-film for use for a thin-film transistor [T. Noguchi, T. Ohshima, & T. Hayashi; Polysilicon Films and Interfaces, Boston, 1987, Mater. Res. Soc. Symp. Proc., Vol. 106, p. 293 (Elsecier Science Publishing, New York, 1988)].

The detail thereof is described below.

In this method, initially, an amorphous Si layer is formed on a substrate. The amorphous Si layer may be formed by a known method such as implantation of Si ions into a polycrystalline Si layer for amorphousness, thermal decomposition of $SiH_4$ by chemical vapor deposition, and deposition of Si by electron-beam vapor deposition on a substrate kept at room temperature.

Subsequently, the amorphous Si layer is heat-treated at 600° C. in nitrogen atmosphere for several to several ten hours. Thereby, crystal nuclei are formed in the amorphous Si layer, and the nuclei grow larger with the length of treatment time resulting finally in mutual collision of the crystal grains, forming crystal boundaries. For example, an amorphous Si layer of about 1000 Å thick formed by Si ion implantation comes to have crystal grains of as large as 5 μm diameter by thermal treatment at 600° C. for 100 hours. A thin-film transistor formed on a polycrystalline Si layer having such a large grain diameter is observed to have a carrier mobility of more than 100 cm²/vsec. Accordingly, this treatment is a significantly useful method for grain growth.

However, the inventors of the present invention have found the disadvantages of the above-mentioned prior art as the result of practical experiment and detailed consideration as below.

(1) An amorphous silicon layer will not crystallize at a temperature below 600° C., so that the treating temperature cannot be lowered. For example, no crystal nucleus is formed by a heat treatment at 550° C. for 2000 hours in the silicon layer which is kept amorphous. The temperature 600° C. is generally higher than the heat resistance temperature of glass employed for amorphous Si thin-film transistors. Therefore, heat-resistant expensive quartz glass has to be used as the base material.

(2) Generally, crystallization of amorphous thin film by solid-phase crystal growth requires time of as much as multiples of ten hours from the start of heat treatment to achieve complete polycrystalline state independently of temperature. This is because the induction period from the start of the heat treatment to formation of crystal nuclei is as much as multiples of ten hours, and the growth of the crystal nuclei to crystal grain is extremely slow. For example, in amorphous Si formed by $Si^+$ ion implantation is observed to exhibit induction period of about 10 hours at 600° C., and requires long time of 100 hours from the start of the heat treatment to the completion of crystallization of the whole film.

The above two problems are serious in industrial production from the standpoint of production efficiency and production cost, which have to be solved naturally.

(3) In addition to the disadvantage of (2) above, the nucleus formation in the amorphous Si occurs at random positions, so that the grain boundaries, which are formed by mutual collision of grown crystal grains, formed at random positions, which cannot be controlled. In fact, $Si^+$ implantation for effecting amorphousness of the polycrystalline Si layer, and subsequent heat treatment at 600° C. will give a polycrystalline layer having a crystal diameter of 5 μm at the most. However, the grain size distributes broadly from 1 μm to 5 μm, which gives rise to variation of characteristics of the elements, and may cause a great disadvantage practically.

For example, a field-effect transistor, provided on the above-mentioned polycrystalline Si layer comprising large grains on a 4-inch substrate, exhibits variation of the electron mobility of 110 cm²/v.sec relative to 110 cm²/v.sec and variation of the threshold value of ±0.5 v, which variations are significantly larger than those of the transistor provided on a single crystal Si substrate, causing a large obstruction in constructing an integrated circuit.

(4) Donor-acceptor impurities which modify electrical properties generally such as P, B, As, etc. are known to affect the growth of Si crystal. In particular, P is known to promote abnormal grain growth. (Y. Wada & S. Nishimatsu, *J. Electrochem. Soc*, Vol. 125, No. 9, p 1499)

The inventors of the present invention, however, after long period of comprehensive study on every kind of impurity, have found that the aforementioned donor-acceptor impurities accelerate crystallization only when the impurity is introduced in a large amount near to the solid-solubility limit, and in that case an $n^+$ or $p^+$ layer is formed which is unsuitable for an active semiconductor, layer, making difficult the preparation of elements.

SUMMARY OF THE INVENTION

The present invention intends to solve the above-described problems in the prior art.

One object of the present invention is to provide a molded article of a polycrystalline semiconductor thin-film which can be prepared at a low temperature within a short time and having a large size of grain, and a method for preparation thereof.

Another object of the present invention is to provide a method of preparation of a semiconductor film which enables control of the positions of nucleus formation and definition of the position of grain boundary in order to narrow the grain size distribution, and a semiconductor film prepared thereby.

Still another object of the present invention is to provide a crystalline Si semiconductor thin-film which allows the control of the position of nucleus formation in the solid phase, and allows recrystallization at a higher rate at a lower temperature in order to narrow the grain size distribution after the solid phase recrystallization, thus giving a high performance device.

A further object of the present invention is to provide a method for forming a semiconductor thin-film by solid-state growth to give large-grain-size polycrystalline layer in which Sn is added to an amorphous Si layer in order to lower the formation temperature and to shorten the formation time.

A still further object of the present invention is to provide a method for forming a semiconductor thin-film in which the Si layer with Sn contained therein serves normally as an active semiconductor layer owing to a characteristic effect of the neutral impurity without causing problem in preparation of semiconductor-functioning element such as a transistor, and which has improved performance in comparison with those containing no Sn and allows the use of inexpensive glass as a substrate economically because of the low heat-treatment temperature of lower than 600° C. for polycrystalline film formation.

A still further object of the present invention is to provide a method for forming a semiconductor thin-film in which the position of the grain boundaries, which causes obstruction in element preparation, can be controlled by localized addition of Sn to control artificially the nucleation point, and can exclude existence of grain boundaries, which lowers the characteristics of the element, from the functioning region of the element.

A still further object of the present invention is to provide a semiconductor thin-film in which the grain size distribution, which is the main cause of variation of the element in growing the polycrystalline thin-film by conventional solid-phase growth, is narrowed.

A still further object of the present invention is to provide a method for forming a semiconductor thin-film which enables design of nucleation spots artificially at an arbitrary distance, and preparation of large grain of 10 μm or larger in comparison with the maximum grain size of about 5 μm by conventional solid phase growth.

A still further object of the present invention is to provide a method for forming a semiconductor thin-film in which high-Sn-concentration regions are formed locally in Sn-containing amorphous Si to control grain positions in a flat thin film, and crystalline Si thin-film can be formed with narrow grain size distribution at a low temperature with a high productivity.

A still further object of the present invention is to provide a semiconductor thin-film in which devices can be prepared by avoiding grain boundaries because the position of the grain boundary may be preliminarily decided so as to avoid grain boundaries which affect adversely the performance of devices in device production, and is capable of giving higher characteristics and narrowing variation of characteristics of elements.

A still further object of the present invention is to provide a method for forming a semiconductor thin-film by which an amorphous layer is preliminarily deposited and the crystal structure only is converted by solid phase growth without causing change of the external shape during the crystal structure conversion, thus crystalline being allowed to grow uniformly in a flat state in an extremely thin layer (for example, not more than 1000 Å).

According to one aspect of the present invention, there is provided a method for forming a semiconductor thin-film, comprising heat-treating an amorphous silicon thin-film containing tin (Sn) to cause crystal growth in a solid phase, and a semiconductor thin-film prepared thereby.

According to another aspect of the present invention, there is provided a semiconductor thin-film, comprising a substrate, and a polycrystalline Si semiconductor thin-film provided on the substrate and containing Sn in an amount of from $1 \times 10^{15}$ atom/cm$^3$ to $1 \times 10^{22}$ atom/cm$^3$.

According to still another aspect of the present invention, there is provided a method for forming a semiconductor thin-film, comprising forming on a substrate an amorphous Si semiconductor thin-film containing added Sn, heat-treating the thin-film at a temperature of not higher than the melting point thereof to cause crystallization to form a semiconductor thin-film constituted of polycrystalline Si.

According to further aspect of the present invention, there is provided a method for forming a semiconductor thin-film, comprising providing, in an amorphous silicon thin-film, an Sn-added region to which tin (Sn) is added for forming crystal nuclei on heat-treatment, heat-treating the amorphous silicon thin-film at a temperature below the melting point of the amorphous silicon thin-film, and allowing crystal to grow in a solid phase from the crystal nuclei formed in the Sn-added region to form a semiconductor thin-film, and the semiconductor thin-film formed thereby.

According to still further aspect of the present invention, there is provided a method for forming a semiconductor thin-film, comprising providing, at a desired position of amorphous Si film containing tin (Sn), a region having a sufficiently minute area so as to form only one nucleus from which a single crystal is grown and having a higher Sn-atom density than other minute region in the amorphous Si film; heat-treating the amorphous Si film at such a temperature that crystal grows from the single nucleus in the minute region and no crystal nucleus is formed in the other region of the amorphous Si film; and allowing crystal to grow in a solid state in the amorphous Si film on the base of the crystal, and a semiconductor thin-film formed thereby.

BRIEF DESCRIPTION OF THE DRAWINGS

FIG. 1 is a graph showing the dependency of crystallization-initiating temperature on the implantation level of Sn.

DETAILED DESCRIPTION OF THE PREFERRED EMBODIMENT

Figure 2A:
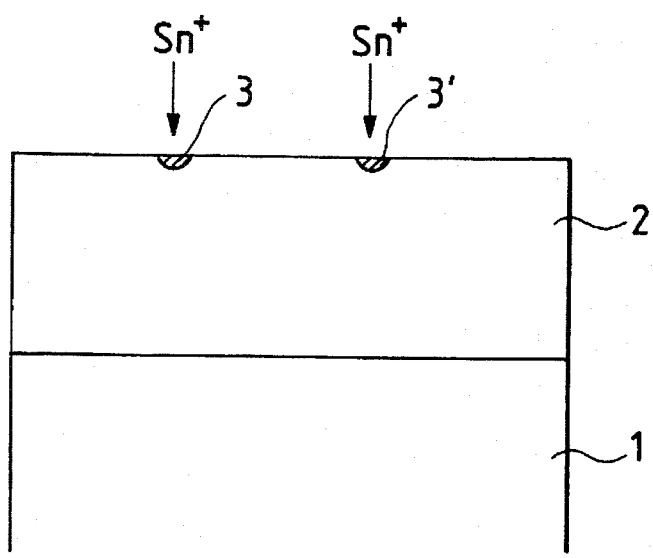
FIGS. 2A to 2C and FIGS. 3A and 3B are schematic explanation of the process of forming the semiconductor thin-film of the present invention.

The inventors of the present invention noticed "a neutral impurity" (Group IV impurity) for solving the above-mentioned problems involved in the prior art.

The Group IV impurity which the inventors noticed and which does not impart polarity to a silicon semiconductor when added is required not only to be a neutral impurity but also to have a low melting point and a high solid-solution limit, not to form a dopant level in a band gap of Si, not to form a deep recombination level, and to give a sufficiently long life to carriers.

The inventor of the present invention comprehensively investigated the impurities that satisfy the above requirements, and conducted many experiments repeatedly regarding Sn, consequently having succeeded in lowering the crystallization initiation temperature and in forming polycrystalline film having a large grain size in a short time.

Because of the lowered crystallization initiation temperature in the present invention, the substrate need not be highly heat-resistant, so that inexpensive non-single crystal material such as glass may be used as the substrate.

Amorphous Si semiconductor film containing Sn may be formed, for example, by depositing on a substrate a polycrystalline thin film having fine grain size (less than 500 Å) at 600° C. by a thermochemical vapor deposition (CVD) of $SiH_4$, and implanting Sn ions by an ion implantation method, or electron-beam vapor deposition, glow discharge, sputtering or a like method.

An amorphous silicon thin-film may be formed directly by chemical vapor deposition, and Sn-containing material may be used as a gas component in the chemical vapor deposition.

The Sn-containing amorphous Si semiconductor film in the present invention is made polycrystalline by heat treatment. The heat treatment is conducted at a temperature not higher than the melting point of the Sn-containing amorphous Si semiconductor film in a solid state region.

The amount of the addition of Sn is preferably not more than $1 \times 10^{22}$ atom/$cm^3$, since an amount of the addition exceeding $1 \times 10^{22}$ atom/$cm^3$ may cause deposition of β-Sn after the heat treatment, which is unfavorable in forming a semiconductor apparatus. The lower limit of addition of Sn is preferably $1 \times 10^{15}$ atom/$cm^3$ since the effect of the present invention can not be achieved generally in a lower amount of addition of Sn.

The thickness of the semiconductor thin-film depends on the device to be formed. For TFT, for example, the thickness is preferably in the range from 500 Å to 2000 Å. Generally the thickness of about 1000 Å is preferable for use as a semiconductor device.

FIG. 1 illustrates the dependency of crystallization temperature (crystallization initiation temperature) on the amount of the implantation in the case where Sn ion is implanted to a polycrystalline Si layer for amorphousness. The Si layer had a thickness of 1,000 Å, and Sn is implanted with implantation energy of 110 keV with the implanting depth reaching approximately middle portion of the Si layer. An increase of the amount of Sn implantation from $1 \times 10^{15}$ $cm^{-2}$ to $1 \times 10^{16}$ $cm^{-2}$ lowers the temperature of formation of crystal nuclei in the Si layer made amorphous by Sn implantation by 100° C., namely from 600° C. to 500° C., which were confirmed by transmission electron microscopy after the heat treatment.

As described above, the inventor of the present invention found the dependency of crystallization initiation temperature on the added amount of an, and succeeded to control the nucleation site by changing locally the Sn concentration in the Si layer by utilizing the above phenomenon. The grain size and the position of the grain boundaries may be controlled by controlling the nucleus forming site.

The invention is described more specifically below.

In order to control the grain size and the grain boundary position of polycrystalline silicon thin-film, the Sn-added region containing locally a high concentration of tin (Sn) should preferably be minute enough for crystal growth to be caused from a single nucleus. The size of the Sn-added region is preferably not more than 2 μm, still preferably not more than 1 μm, in maximum diameter.

Outside the above-mentioned Sn-added region containing locally a high concentration of tin (Sn), Sn need not be contained, but may be contained in a lower concentration than in the Sn-added region in order to accelerate crystal growth in the solid phase. In the latter case, the concentration of Sn is preferably not more than $10^{-2}$ times that in the Sn-added region from the standpoint of positional control of nucleus formation and acceleration of the crystal growth.

The heat treatment is carried out at a temperature below the melting point of the amorphous semiconductor, to cause crystal growth in the solid phase to form a crystalline semiconductor film.

In the heat treatment, the initiation site of the crystal growth in the solid phase is controlled by providing the an-added region containing tin (an) locally in a high concentration in the amorphous silicon thin-film.

This positional control of nucleus formation in the solid phase is conducted on the basis of the finding that the crystallization initiates at a lower temperature in the Sn-added region than in a Sn-non-added region. In order to control the position of the grain boundary, the heating temperature is preferably such that the crystal grows from the nucleus formed in the an-added region but a nucleus cannot be formed in an Sn-non-added region. The semiconductor thin-film can be formed at a relatively low temperature of from 500° C. to 650° C. If glass is used as the substrate material, the maximum temperature of the heat treatment is preferably below 600° C. to prevent deformation of the substrate material.

Figure 2B:
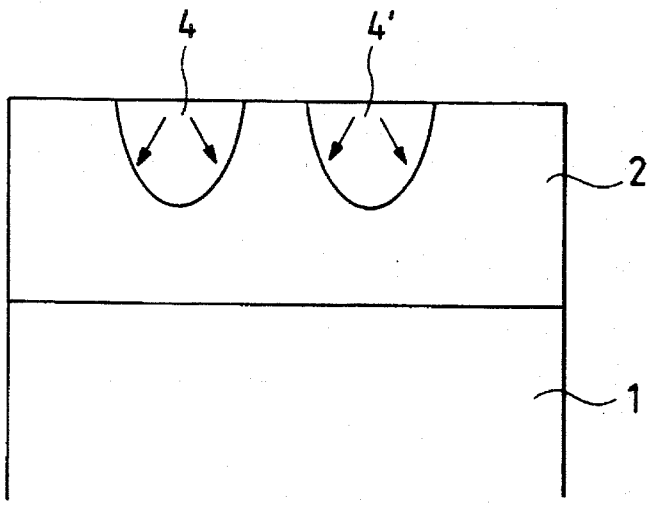
Figure 2C:
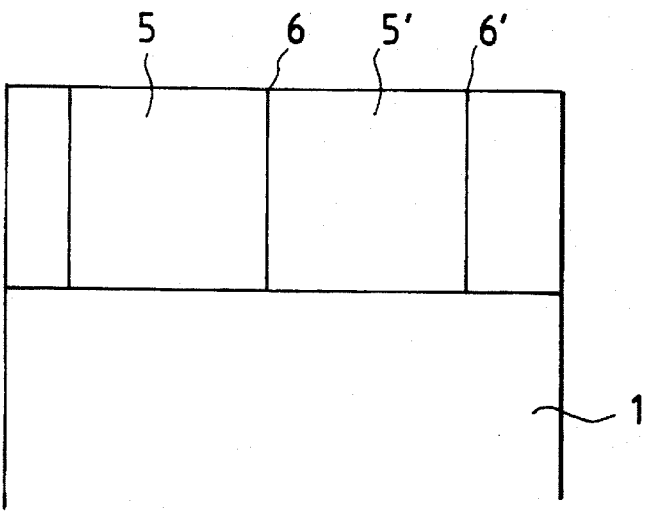

In the case of amorphous Si and Sn employed, as shown in FIG. 2, Sn is added locally to the predetermined sites inside the amorphous Si 2 formed on a $SiO_2$ substrate 1 (FIG. 2A), and subsequently heat treatment is conducted at such a temperature that Sn-containing amorphous Si (Sn-added region) 3 only will crystallize to form nuclei. In the other amorphous Si region (Sn-non-added region), no nucleus is formed because the crystallization temperature thereof is sufficiently higher than that of the impurity-added region. Continuation of the heat treatment causes the growth of the positionally controlled nuclei into amorphous Si region (FIG. 2B). This is because the phase transition of amorphous Si phase to a crystalline phase having a nucleus formed will occur with lower energy than the activation energy required for nucleus formation in an amorphous phase. Further continuation of the heat treatment gives rise to collision of the positionally controlled crystal grains 4 and 4', forming a grain boundary 6 between the nucleus-forming positions (FIG. 2C).

Figure 3A:
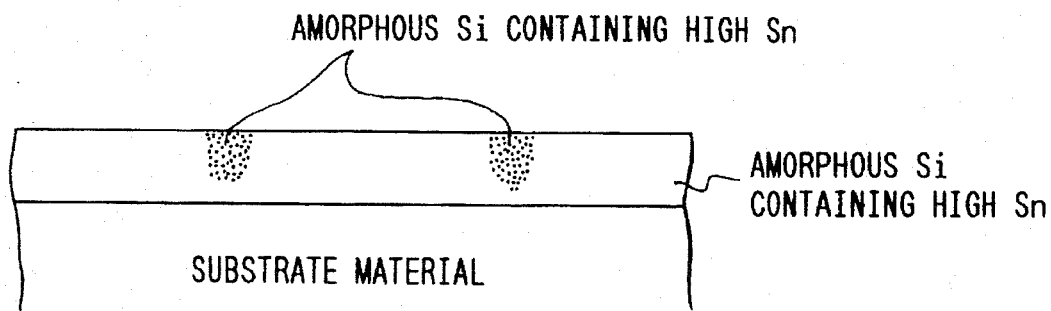
Figure 3B:
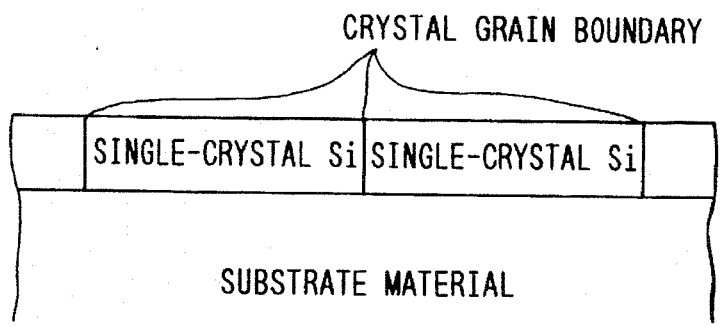

FIG. 3 shows control of the position of the nucleus formation by forming the regions locally containing a higher concentration of Sn.

An amorphous Si layer with Sn added is formed on a substrate material. In the layer, regions having locally a higher concentration of Sn are formed at a predetermined spacing (FIG. 3A). The substrate is treated thermally to cause solid phase recrystallization at a temperature such that only the regions of a higher Sn concentration crystallize, i.e. lower than the temperature of crystallization of the regions of a lower Sn concentration, thus forming Si nuclei only in the region of a higher Sn concentration. Further continuation of the heat treatment leads to growth of the crystal in the solid phase into the region of a lower Sn concentration forming no nucleus, causing collision with the grain generated at the adjacent region of higher Sn concentration around the midpoint, thereby the amorphous Si region disappearing and a positionally controlled grain boundary being formed at the position of the collision (FIG. 2B).

The Si nucleus is formed at a portion of a high Sn density, the crystal growing in solid phase keeping a single domain to a low density portion, since the activation energy for growth of crystal from a nucleus having once formed is lower than the activation energy for nucleus formation to surmount the barrier of the surface energy.

The Examples of the present invention are described below.

EXAMPLE 1

On a glass plate as a substrate, a polycrystal layer constituted of fine grains (less than 500 Å in diameter) was deposited by thermochemical vapor deposition of $SiH_4$ at 600° C. to a thickness of 1,000 Å.

The ion implantation was conducted into the polycrystal layer under the conditions shown in Table 1.

TABLE 1

| Sample No. | Implanted ion | Accelerating voltage (kV) | Dose ($cm^{-2}$) |
|---|---|---|---|
| 0 | Si | 70 | $5 \times 10^{15}$ |
| 1 | Sn | 110 | $1 \times 10^{15}$ |
| 2 | Sn | 110 | $1 \times 10^{16}$ |
| 3 | Sn | 110 | $1 \times 10^{17}$ |

The accelerating voltage of 110 kV was selected so that the projection range (implantation depth) reaches the middle of the Si layer, resulting in the range of 498 Å from the surface.

As shown in Table 1, into Sample of No. O, Si ion was implanted with a dose of $5\times10^{15}$ ion/cm$^2$ at 70 kV, and into Samples of No. 1 to 3, Sn ion was implanted at 70 kV with doses of $1\times10^{15}$, $1\times10^{16}$, and $1\times10^{17}$ ion/cm$^2$, respectively.

Samples of No. 0, No. 1, and No. 2 as implanted, or before the heat treatment had an structure of amorphous Si according to the observation by transmission electron microscopy, and exhibited in electron beam diffraction a halo pattern which is characteristic to amorphous Si. On the other hand, Sample of No. 3 into which Sn was implanted at a higher concentration of $1\times10^{17}$ ion/cm$^2$ (corresponding to Sn concentration of $1\times10^{22}$ ion/cm$^3$ in the 1,000Å-thick Si layer) crystallized already at the time of implantation, and was found to have β-Sn deposited after heat treatment at about 500° C. by scanning type transmission electron microscopy. Accordingly the tests below were omitted as to this sample.

Figure 4:
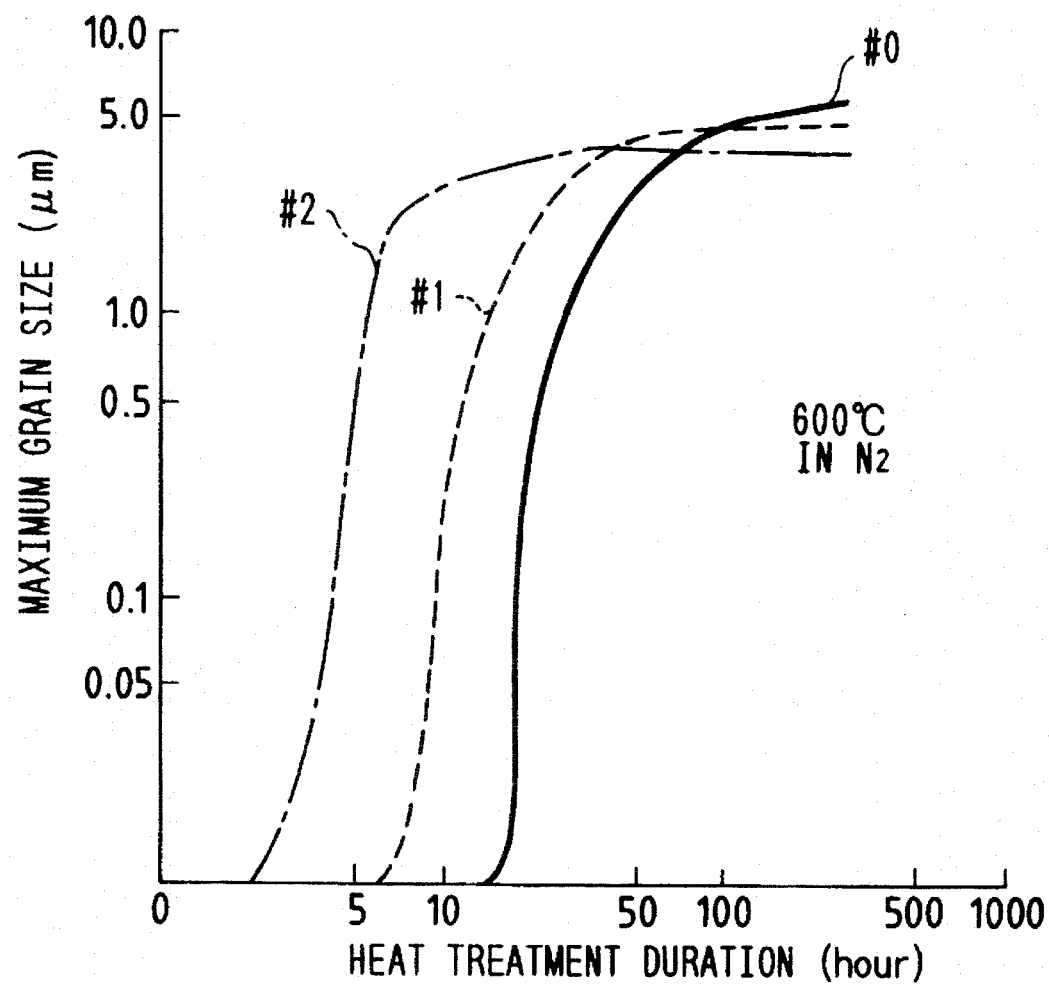
FIG. 4 and FIG. 5 show effect of Sn addition on the maximum grain size.

Samples of No. 0, No. 1, and No. 2 were subjected to constant-temperature heat treatment at the temperature of 600° C. in a nitrogen atmosphere as shown in FIG. 4. Consequently, in the Si layer made amorphous by implantation of $Si^+$ ion without Sn addition, nuclei were formed in the amorphous Si only after 10 or more hours of induction period, and thereafter the crystal extended in a dendrite form to cause collision with the adjacent crystal grain, resulting in disappearence of amorphous region and crystallization of the whole layer, thus giving a thin-film polycrystal. In approximately 100 hours, the maximum grain size became saturated with the grain size exceeding 5 μm.

In Sample of No. 1, into which Sn was implanted with a dose of $1\times10^{15}$ ion/cm$^2$, the induction period was approximately 6 hours, and the formed crystal became saturated in 20 hours with the maximum grain size of about 4.8 μm.

In Sample of No. 2, into which Sn was implanted at a higher concentration with a dose of $1\times10^{16}$ ion/cm$^2$, the induction period was 3 hours or less, and the maximum grain size became saturated at about 4.5 μm in 6 hours.

The maximum saturated grain size decreased with the increase of the Sn dose. This is considered to be due to the increase of nucleus forming rate with the increase of the amount of Sn added. The increase of the Sn addition is considered to give rise to an increase of the nucleation density at the time of grain collision in the amorphous Si, resulting in some decrease of the grain size.

Figure 5:
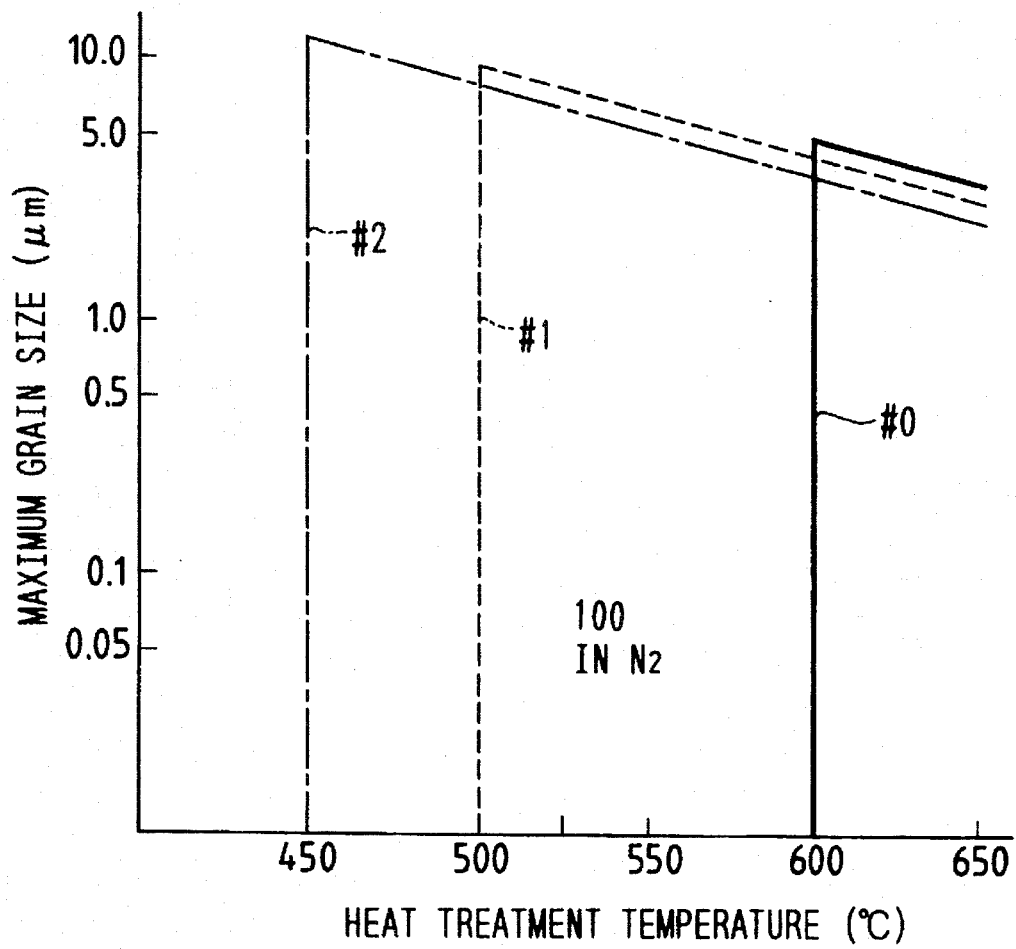

FIG. 5 illustrates the dependency of the grain size on heat-treatment temperature at the treatment for 100 hours constantly under a nitrogen atmosphere. In Sample of No. 0 not containing Sn, no crystallization occurred below 600° C. even with 100 hours or more of heat treatment, while at 600° C. or a higher temperature the nucleation density increased, with tendency of a smaller grain size at a higher heat-treatment temperature because of the higher nucleation density at a higher temperature. In Sample No. 1, into which Sn was implanted with a dose of $1\times10^{15}$ ion/cm$^2$, the crystallization initiated at 500° C. that is lower by 100° C. than the samples without addition, and the nucleation density could be kept lower than that at 600° C., so that the maximum grain size approached to approximately 10 μm by heat treatment for 100 hours.

In Sample of No. 2, into which Sn is added with a dose of $1\times10^{16}$ ion/cm$^2$, the crystallization initiated at a temperature as low as 450° C., giving the maximum grain size exceeding 10 μm.

As described above, the induction period could be shortened and the crystallization temperature could be lowered by addition of Sn, and the crystal grain was made possible to grow to a larger size.

An FET (Field-effect transistor) was prepared by use of the Sn-doped polycrystal thin-film of a large grain size obtained by the present invention according to a usual IC process. The FET exhibited normal static characteristics of a transistor as one formed on a film containing no Sn, with the carrier mobility increasing with increase of the grain size, resulting in improvement by 20 to 40% (120 to 140 cm$^2$/vsec in electron mobility). Additionally, crystallization occurred at 500° C. or lower, which permits the use of inexpensive glass, thereby having economical effects.

EXAMPLE 2

The method of addition of Sn into an Sn thin-film is not limited to ion implantation. Another method is described below.

An amorphous Si thin-film was formed on a glass substrate by vacuum chemical vapor deposition at a treatment temperature of 550° C. to give a thickness of 1,000 Å.

Subsequently Sn layer was deposited on the surface of the amorphous Si to a thickness of 50 Å by vacuum vapor deposition, which was heat-treated at temperatures of from 400° C. to 600° C. In the heat treatment, the crystallization initiated at 450° C. similarly to the preceeding Example, giving a similar grain size thereto (approximately 10 μm).

The surface layer was treated with a mixture of hydrofluoric acid and nitric acid to remove the remaining Sn, thus providing a transistor which has satisfactory characteristics similar to those in the preceeding Example.

EXAMPLE 3

On an amorphous SiO$_2$ substrate 1 (thermally oxidized Si or glass), polycrystalline Si was deposited at 620° C. to a thickness of 1,000 Å by vacuum chemical vapor deposition. Further, Si ion was implanted over the entire surface thereof with an accelerating energy of 70 keV with a dose of $5\times10^{15}$ ion/cm$^2$, to change the polycrystalline Si into an amorphous Si 1.

Sn impurity was locally added by focusing ion beam implantation in a maskless process under the conditions of an Sn$^{++}$ beam diameter of 0.1 μm, a dose of $1\times10^{15}$ ion/cm$^2$, an accelerating energy of 50 keV, spacings of 10 μm, 20 μm, and 30 μm in a lattice arrangement, in a size of 2 μm square, to form implanted portions (Sn-added region) 3 (FIG. 2A).

Subsequently, heat treatment was conducted therewith at 550° C. for 100 hours in an nitrogen atmosphere to grow Si crystal 4. Since no nucleus was formed in Sn-non-added amorphous Si during the heat treatment, so that crystal regions 5 extend from the Sn-implanted region in a dimension of approximately 10 μm, and the grain boundaries 6 were formed at the midpoints between the implanted sites (FIG. 2B and FIG. 2C). The grain sizes were confirmed to distribute respectively in the range of 10 μm±1 μm, 20 μm ±2 μm, and 30 μm±3 μm by transmission electron microscopy.

EXAMPLE 4

On an SiO$_2$, amorphous Si was deposited to a thickness of 1,000 Å at 550° C. by vacuum chemical vapor deposition. Thereafter, Sn-added regions of 1 μm square were formed in the amorphous Si in lattice arrangement by implanting Sn at a dose of $1\times10^{15}$/cm by employing a resist as a mask having apertures of 1 μm square at a spacing of 10 μm, 20 μm, or 30 μm with an accelerating energy of 50 keV. After removal of the resist, the amorphous Si was heat-treated at 550 ° C. for 100 hours in a nitrogen atmosphere. The observation of crystal structure by transmission electron microscopy showed that the grain boundaries were formed in lattice arrangement between the Sn-implanted regions with grain sizes respectively of 10 μm±1 μm, 20 μm±2 μm, and 30 μm±3 μm.

EXAMPLE 5

Figure 6A:
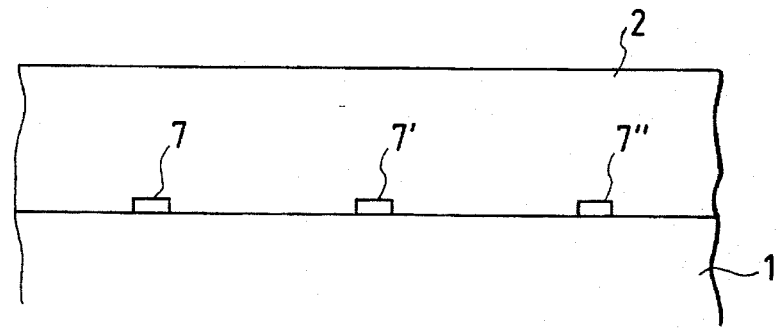
FIGS. 6A to 6C and FIGS. 7a to 7C are schematic explanation of the process of forming the semiconductor thin-film of the present invention.

As shown in FIG. 6, Sn was deposited by vacuum vapor deposition in a thickness of 100 Å on an amorphous SiO$_2$ substrate 1, and then the Sn thin-films 7 were formed in 1 μm square at a spacing of 10 μm, 20 μm, or 30 mm according to photolithography (FIG. 6A).

Figure 6B:
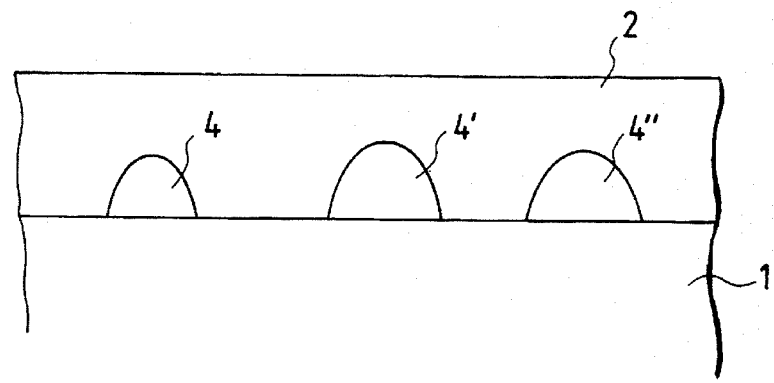
Figure 6C:
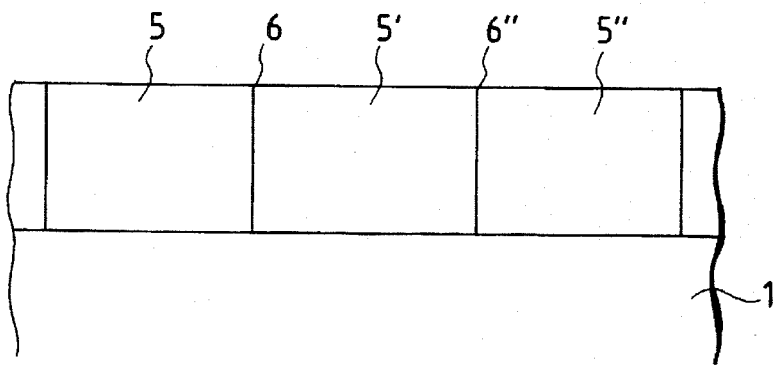

Further thereon, an amorphous Si layer 2 was deposited at 100° C. to a thickness of 1,000 Å by plasma chemical vapor deposition. Then the Si crystals 4 were allowed to growth by heat treatment at 550° C. for 100 hours (FIG. 6B and FIG. 6C). The observation of crystal structure by transmission electron microscopy shows that the grain boundaries 6 of the Si crystals 5 were formed between the Sn regions with the grain sizes respectively of 10 μm±1 μm, 20±2 μm, and 30 μm±3 μm. The Sn melted during the heat treatment (550° C.) and diffused into Si since the Sn layer has a melting point of 232° C.

EXAMPLE 6

Figure 7A:
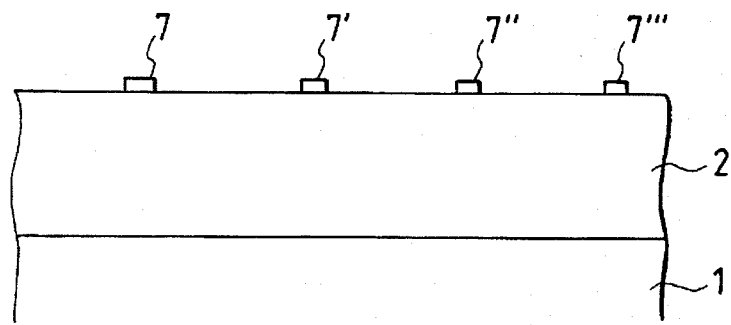
Figure 7B:
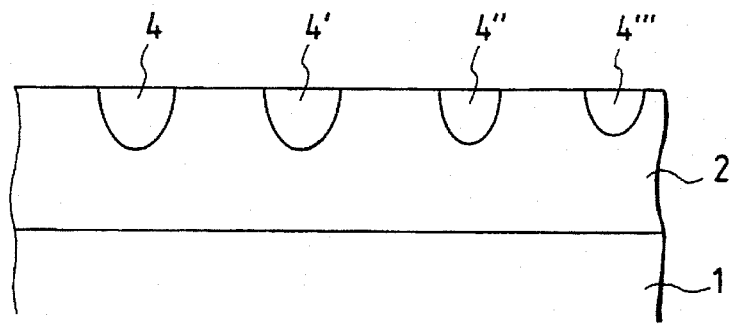
Figure 7C:
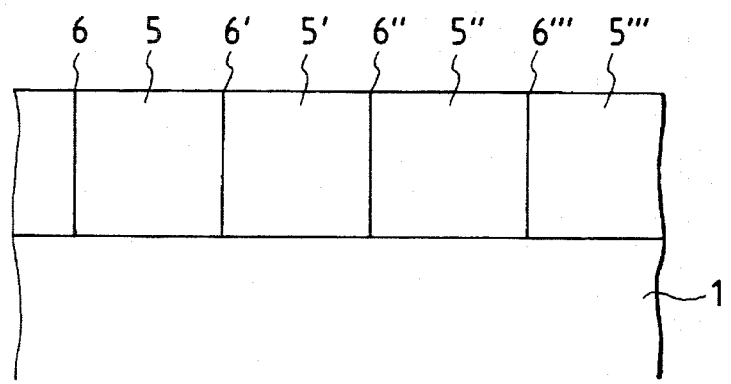

As illustrated in FIG. 7, polycrystalline Si was deposited at 620° C. to a thickness of 1,000 Å on an SiO$_2$ substrate 1 by vacuum chemical vapor deposition. Subsequently Si ions were implanted over the entire surface thereof with a dose of $5\times10^{15}$ ion/cm$^2$ with an accelerating energy of 70 keV to change the polycrystalline Si layer into an amorphous Si layer 2. Further thereon, an Sn layer was formed to a thickness of 100 Å by vacuum vapor deposition (at room temperature). The Sn regions 7 of 1 μm square were formed at a spacing of 10 μm, 20 μm, or 30 μm by photolithography. Then the Si crystals 4 were allowed to grow by heat treatment at 550° C. for 100 hours in a nitrogen atmosphere. After etching for development of latent defects, observation of crystal structure by scanning electron microscopy showed that the grain boundaries of the resulting Si crystals 5 were located at the mid points between the Sn region in lattice arrangement, and the grain sizes were 10 μm±1 μm, 20±2 μm, and 30 μm±3 μm respectively corresponding to the spacings of the Sn region.

EXAMPLE 7

A polycrystalline Si thin-film was deposited to a thickness of 1,000 Å on a glass substrate by thermal decomposition of SiH$_4$ according to vacuum chemical vapor deposition at 620° C. The grain size of the formed polycrystalline Si thin-film was not more than 500 Å.

Thereto Sn ion implantation was conducted twice. Firstly Sn$^+$ was implanted over the entire surface with an implantation dose of $1\times10^{15}$ ion/cm$^2$ with an implantation energy of 110 keV to make amorphous the entire body of the polycrystalline Si thin-film. Then a resist was applied and holes of 1 μm diameter were provided therein by usual lithography with a spacing of 5 μm or 10 μm in lattice arrangement. The second Sn ion implantation was conducted by employing the patterned resist as the mask with an implantation dose of $1\times10^{16}$ ion/cm$^2$ and implantation energy of 50 keV. After peeling-off of the resist mask, heat treatment was conducted at 500° C. for 50 yours in an nitrogen atmosphere. Observation by transmission electron microscopy showed that the grain boundaries were arranged in an unchanged flat film of 1,000 Å at spacing of 5 μm, or 10 μm in lattice arrangement, and the distribution of the grain size were 11 μm for the averages of 5 μm, and 10 μm. In the amorphous Si layer which had not been subjected to the second Sn addition treatment, no crystal nucleus was formed by the heat treatment at 500° C. for 50 hours, which shows that the Sn addition in this Example achieved the shortening of the latent period of nucleus formation and increase of growth rate.

The Si layer of the starting material may, of course, be amorphous as deposited. Amorphous Si provided by vacuum chemical vapor deposition at 550° C. or amorphous Si containing hydrogen provided by glow discharge may also be employed as the starting material, giving the similar effect. The ion implantation may be conducted by a maskless process by employing a focused ion implantation method.

EXAMPLE 8

On a 4-inch glass substrate, an Sn-added Si thin film was formed which has grain size distribution of 5 μm 11 μm according to the present invention, from which 100 field-effect transistors with a channel length of 3 μm were prepared according to the usual IC process. The electron mobility thereof was 200±10 cm$^2$/vsec, and the threshold value was 1.5±0.2 V. The channel portion of the transistor could be arranged so as not to include any grain boundary since the location of the grain boundaries are preliminarily known, whereby the characteristics of the elements are improved and distributed within a narrow range.

What is claimed is:

1. A method for forming a semiconductor thin film, comprising:
   (i) preparing an amorphous silicon thin film containing tin;
   (ii) forming a region in said amorphous silicon thin film by incorporating tin in an amount of $1\times10^{15}$ atom/cm$^3$ to $1\times10^{22}$ at a desired position of said amorphous silicon thin film, said region having a sufficiently minute area so as to form only one single nucleus from which a single crystal is grown and having a higher tin-atom density than other portions in said amorphous silicon thin film containing tin said other portions having a tin-atom density not more than $10^{-2}$ times the density of the area of higher tin-atom density;
   (iii) heat-treating said amorphous silicon thin film at a temperature such that said single crystal grows only from said single nucleus in said minute area and crystal nucleus is inhibited from forming in said portions of said amorphous thin silicon thin film having said lower tin-atom density; and
   (iv) growing said single crystal in a solid state in said amorphous silicon thin film on the base of said crystal nucleus.

2. The method for forming a semiconductor thin film according to claim 1, wherein tin atoms are introduced into said desired portion by ion-implantation.

3. A method for forming a semiconductor thin film, comprising:
   (i) forming an amorphous silicon thin film having a first region containing tin in an amount of $1\times10^{15}$ atom/cm$^3$ to $1\times10^{22}$ atom/cm$^3$ and a second region containing tin at a tin-atom density not more than $10^{-2}$ times the density of said first region, said first region having a sufficiently minute area so as to form only one single nucleus from which a single crystal is grown;
   (ii) heat-treating said amorphous silicon thin film at a temperature such that said single crystal grows only from said single nucleus in said minute area and crystal nucleus is inhibited from forming in said other region; and
   (iii) growing said single crystal in a solid state in said amorphous silicon thin film on the base of said crystal nucleus.

4. The method for forming a semiconductor thin film according to any one of claims 1 to 3, further comprising heat-treating said amorphous thin film at a temperature of not higher than 650° C.

5. A method for forming a semiconductor thin film, comprising:
   (i) forming an amorphous silicon thin film containing tin in an amount of $1\times10^{15}$ atom/cm$^3$ to $1\times10^{22}$ atom/cm$^3$, said film including a first region having a higher tin-atom density than other regions of said film and having a sufficiently minute area so as to allow only a single nucleus to grow from said area said other portions having a tin-atom density not more than $10^{-2}$ times the density of the area of higher tin-atom density;
   (ii) heat-treating said amorphous silicon thin film at a temperature such that said single crystal grows only from said single nucleus in said minute area and crystal nucleus is inhibited from forming in said other region; and
   (iii) growing said single crystal in a solid state in said amorphous silicon thin film on the base of said crystal nucleus.

* * * * *

UNITED STATES PATENT AND TRADEMARK OFFICE
CERTIFICATE OF CORRECTION

PATENT NO. : 5,531,182

DATED : July 2, 1996

INVENTOR(S): T. YONEHARA

It is certified that error appears in the above-identified patent and that said Letters Patent is hereby corrected as shown below: On the title page: Item

[56] REFERENCES CITED

Other Publications, "M. K. Hatalis et al, "Solid Phase Epitaxy of LPCVD Amorpous Silicon Films," should read --M. K. Hatalis et al., "Solid Phase Epitaxy of LPCVD Amorphous Silicon Films,--.

Attorney, Agent, or Firm, "Fitzpatrick Cella Harper & Scinto" should read --Fitzpatrick, Cella, Harper & Scinto--.

COLUMN 1

Line 41, "ten" should read --tens of--.
Line 47, "comes to have" should read --attains--.
Line 51, "100 cm²/vsec." should read --100 cm²/v.sec--.

COLUMN 2

Line 11, "requires" should read --requires a--.
Line 42, "after" should read --after a--.
Line 48, "semiconductor," should read --semiconductor--.

COLUMN 3

Line 14, "problem" should read --problems--.
Line 15, "element" should read --elements--.

UNITED STATES PATENT AND TRADEMARK OFFICE
CERTIFICATE OF CORRECTION

PATENT NO. : 5,531,182

DATED : July 2, 1996

INVENTOR(S): T. YONEHARA

It is certified that error appears in the above-identified patent and that said Letters Patent is hereby corrected as shown below:

COLUMN 4

Line 15, "further" should read --a further--.
    Line 25, "further" should read --a further--.
    Line 31, "region" should read --regions--.
    Line 45, "explanation" should read --explanations--.
    Line 51, "explanation" should read --explanations--.

COLUMN 5

Line 56, "an," should read --Sn,--.

COLUMN 6

Line 17, "an-added" should read --Sn-added-- and "(an)" should read --(Sn)--.
    Line 25, "an-added" should read --Sn-added--

COLUMN 7

Line 40, "an" should read --a--.

COLUMN 8

Line 42, "$cm^2$/vsec" should read --$cm^2$/v.sec--.

UNITED STATES PATENT AND TRADEMARK OFFICE
CERTIFICATE OF CORRECTION

PATENT NO. : 5,531,182

DATED : July 2, 1996

INVENTOR(S): T. YONEHARA

Page 3 of 4

It is certified that error appears in the above-identified patent and that said Letters Patent is hereby corrected as shown below:

COLUMN 9

Line 5, "Si1." should read --Si.--.
    Line 13, "an" should read --a--.
    Line 46, "30 mm" should read -- 30 $\mu$m--.

COLUMN 10

Line 34, "yours" should read --hours-- and "an" should read --a--.
    Line 39, "were" should read --was--.
    Line 58, "11 $\mu$m" should read --to 11 $\mu$m--.
    Line 62, "$cm^2$/vsec," should read --$cm^2$/v.sec--.

COLUMN 11

Line 8, "$1\times10^{22}$" should read --$1 \times 10^{22}$ atom/$cm^3$--.
    Line 13, "tin" should read --tin,--.
    Line 20, "thin" (first occurrence) should be deleted.

UNITED STATES PATENT AND TRADEMARK OFFICE
CERTIFICATE OF CORRECTION

PATENT NO. : 5,531,182

DATED : July 2, 1996

INVENTOR(S) : T. YONEHARA

Page 4 of 4

It is certified that error appears in the above-identified patent and that said Letters Patent is hereby corrected as shown below:

COLUMN 12

Line 22, "area" should read --area,--.

Signed and Sealed this

Fourth Day of February, 1997

Attest:

BRUCE LEHMAN

Attesting Officer

Commissioner of Patents and Trademarks